(12) United States Patent
Miyazaki et al.

(10) Patent No.: US 7,928,560 B2
(45) Date of Patent: Apr. 19, 2011

(54) COMPOSITE MULTI-LAYER SUBSTRATE AND MODULE USING THE SUBSTRATE

(75) Inventors: Masashi Miyazaki, Gunma (JP); Mitsuhiro Takayama, Misato (JP); Tatsuro Sawatari, Shimonoseki-Machi (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 12/780,501

(22) Filed: May 14, 2010

(65) Prior Publication Data
US 2010/0300736 A1    Dec. 2, 2010

Related U.S. Application Data

(63) Continuation of application No. 11/896,013, filed on Aug. 29, 2007, now Pat. No. 7,745,926, which is a continuation of application No. 10/515,953, filed on Jul. 25, 2005, now Pat. No. 7,348,662.

(51) Int. Cl.
*H01L 23/04* (2006.01)

(52) U.S. Cl. ............... 257/711; 257/700; 257/E23.182; 257/679

(58) Field of Classification Search .............. 257/711, 257/700, E23.182
See application file for complete search history.

(56) References Cited

U.S. PATENT DOCUMENTS

| | | | |
|---|---|---|---|
| 5,362,656 A | 11/1994 | McMahon | |
| 5,736,681 A | 4/1998 | Yamamoto et al. | |
| 5,865,934 A | 2/1999 | Yamamoto et al. | |
| 5,868,887 A | 2/1999 | Sylvester et al. | |
| 6,020,637 A * | 2/2000 | Karnezos | 257/738 |
| 6,060,778 A | 5/2000 | Jeong et al. | |
| 6,093,970 A | 7/2000 | Ohsawa et al. | |
| 6,400,010 B1 | 6/2002 | Murata et al. | |
| 6,452,255 B1 | 9/2002 | Bayan et al. | |
| 6,624,523 B2 * | 9/2003 | Chao et al. | 257/796 |
| 6,952,049 B1 | 10/2005 | Ogawa et al. | |
| 2002/0053731 A1 | 5/2002 | Chao et al. | |
| 2002/0066955 A1 | 6/2002 | Shibamoto et al. | |
| 2003/0227077 A1 * | 12/2003 | Towle et al. | 257/678 |

FOREIGN PATENT DOCUMENTS

| | | |
|---|---|---|
| EP | 0647090 A1 | 4/1995 |
| JP | 56-88398 | 7/1981 |
| JP | 58-085372 | 5/1983 |
| JP | 61-140593 | 8/1986 |
| JP | 61-287192 | 12/1986 |
| JP | 05-129742 | 5/1993 |
| JP | 07-086711 | 3/1995 |
| JP | 10-270630 | 10/1998 |
| JP | 11-017348 | 1/1999 |
| JP | 2000-138453 | 5/2000 |
| JP | 2002-016327 | 1/2002 |

* cited by examiner

*Primary Examiner* — Benjamin P Sandvik
*Assistant Examiner* — Krista Soderholm
(74) *Attorney, Agent, or Firm* — Blank Rome LLP

(57) ABSTRACT

A composite multi-layer substrate comprising a flat plate-like core member formed of a material having an excellent electric conductivity, an excellent heat conductivity, and a high rigidity, a front resin layer and a rear resin layer covering at least the front and rear surfaces of the core member, and a bottomless hole formed in the core member through the front and rear sides of the core member, wherein an electronic component is installed in the bottomless hole, whereby since the strength of the composite multi-layer substrate can be assured by the rigidity of the core member, conventional prior art glass cloth can be eliminated, deterioration in the electric characteristics caused by ion migration can be avoided and will result in reduced production cost.

7 Claims, 12 Drawing Sheets

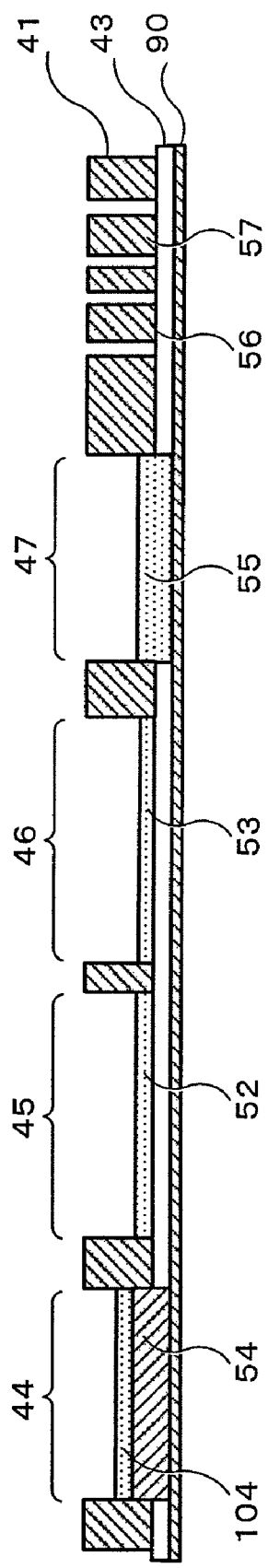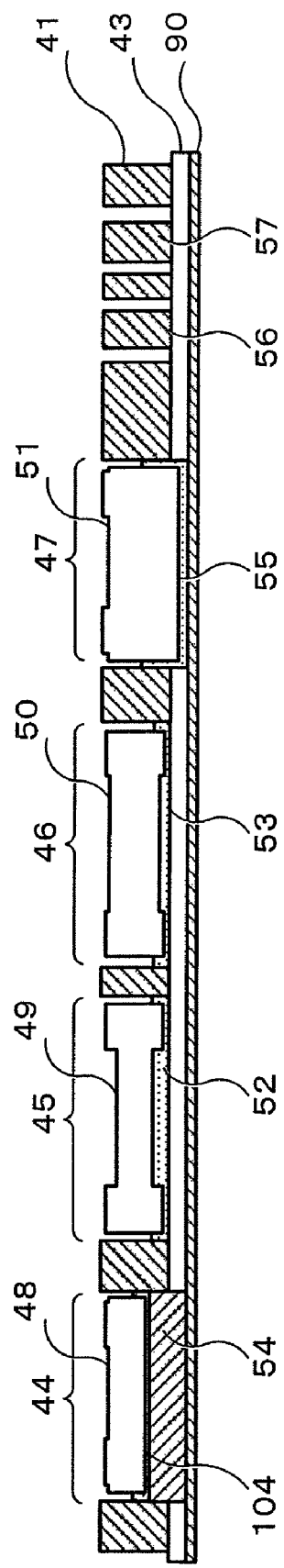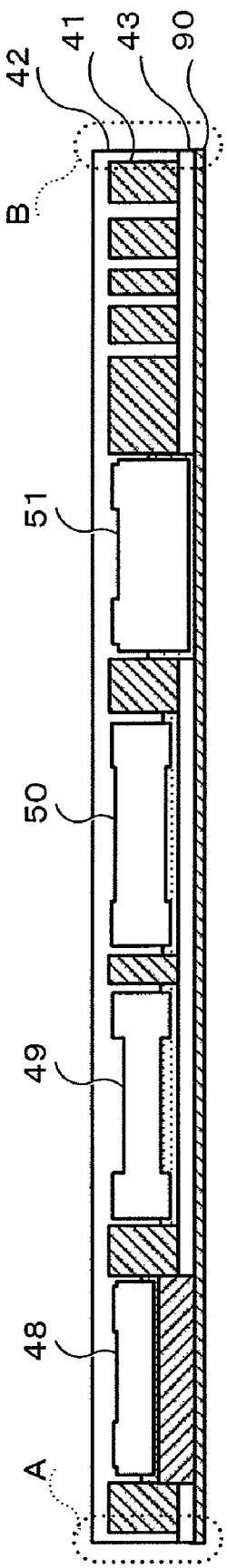

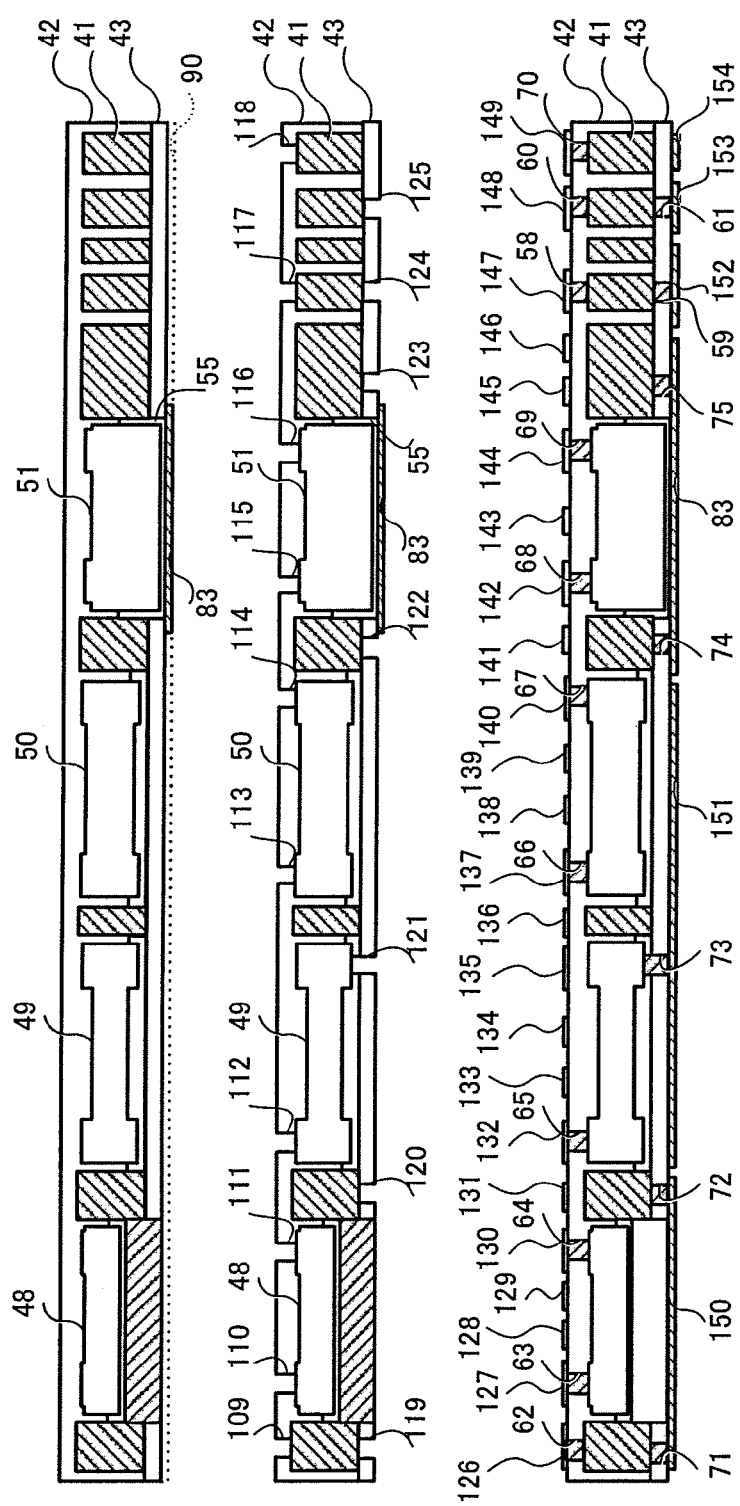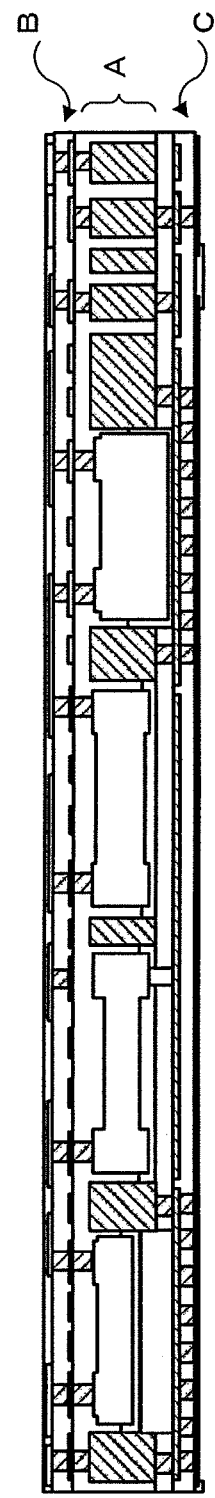

ical components. For example, recently the Chip Size
COMPOSITE MULTI-LAYER SUBSTRATE AND MODULE USING THE SUBSTRATE

REFERENCE TO RELATED APPLICATIONS

The present application is a continuation of and claims the benefit of the filing date of U.S. patent application Ser. No. 11/896,013, filed Aug. 29, 2007 now U.S. Pat. No. 7,745,926, which is a continuation of U.S. patent application Ser. No. 10/515,953, filed Jul. 25, 2005 now U.S. Pat. No. 7,348,662, which in turn claims priority to International Patent Application No. PCT/JP03/06597, which was filed May 27, 2003, which in turn claims priority to Japanese Patent Application No. 2002-156796 filed May 30, 2002, the entire disclosures of which are incorporated by reference herein.

BACKGROUND OF THE INVENTION

1. Field of the Invention

This invention relates to a composite multi-layer substrate and module using a substrate designed to make high density mounting of electronic components feasible.

2. Description of the Prior Art

Conventionally, package miniaturization has been vigorously carried out as the approach for high density mounting of electronic components. For example, recently the Chip Size Package (CSP) and ultimately bare chip mounting which makes the package itself redundant have been realized. However, each of these is premised on arranging and mounting (flat surface mounting method) a plurality of electronic components in a two-dimensional (surface) array. By simple calculation, the fundamental limitation of not being able to reduce the mounting surface areas to less than the size of the added area of each electronic component is retained.

Therefore, a mounting method using embedded mounting of the electronic components in a substrate (more specifically, not only the substrate face) but also the inner section of the substrate attracts attention.

Hereafter, widely known technologies of embedded mounting and their associated drawbacks will be explained.

As an electronic component embedded structure using an organic system substrate, the electronic components are mounted in the front surface of the organic substrate serving as the core (hereinafter "core substrate"). In the case of multi-layering, a structure which encapsulates electronic components in a dielectric (nonconductive) prepreg resin is known (hereinafter "first prior art example"). Furthermore, a structure in which grooves are formed in an organic system substrate wherein electronic components are embedded is known (hereinafter "second prior art example").

Furthermore, as for mounting electronic components on the front surface of a core substrate, a structure (hereinafter "third prior art example") in which holes corresponding to the size of electronic components are drilled in the prepreg and the electronic components are inserted and embedded in the holes of the prepreg when multi-layering or a structure (hereinafter "fourth prior art example") with embedded sintered components by transfer in organic resin are known.

However, the first prior art example and the fourth prior art example have a drawback of being disadvantageous to thin-sizing the substrate. Also, in the second prior art example and the third prior art example, there is a drawback mentioned which involves the processing cost of the grooves or holes. Moreover, because electronic component heat dissipation countermeasures are not entirely taken into consideration, any of the prior art examples (first through fourth prior art examples) have a drawback causing inconvenience in mounting electronic components especially in regard to heat generation in larger semiconductor chips, etc.

Japanese Laid-Open Patent Application (Kokai) (A) No. S54-008871 (1979) titled "SEMICONDUCTOR DEVICE" discloses that in order to provide a solid electronic clock that is thin-shaped and a small size, while forming a pattern in one side of a printed circuit board, the device is made of a printed circuit board and a semiconductor chip of almost the equivalent thickness by adhering a metal plate to the rear surface, forming a "hole" in one or both directions in the pattern or metal plate and mounting a semiconductor chip in the hole. However, by this prior art example, when performing a resin seal of the semiconductor chip and multi-layering, there is a drawback of having to grind off the excess resin requiring additional work and making manufacturing costs more expensive. Additionally, concerning mounting in a hole and electronic component having multiple electrodes, such as the five-sided electrode, etc., there is a drawback that the type of electronic component which can be mounted has limitations and this constitution was not taken into consideration at all.

Japanese Laid-Open Patent Application (Kokai) (A) No. S61-287194 (1986) titled "CHIP CARRIER FOR USE IN ELECTRONIC DEVICES" discloses elevation of the heat dissipation effect in electronic components. An insulating resin is laminated on a metal core front surface of a printed circuit board with a metal core base. While forming "concave portions" which reach to the metal core of that insulating resin, the device uses the metal core as a heat sink by mounting in the concave portions in order for the rear surface of an electronic component to be in contact to the metal core. This prior art example describes concave portions that are formed so the insulating resin laminated to the metal core rear surface (opposite side of the mounting surface of the electronic components) also reaches the metal core and the heat dissipation effect is elevated.

Japanese Laid-Open Patent Application (Kokai) (A) No. S64-011400 (1989) titled "MULTILAYERED PLATE FOR MOUNTING IC CHIP" discloses a means to dissipate the heat of semiconductor chips from adjacent positions and to provide a multi-layer substrate for mounting semiconductor chips without generating improper bonding with the metal plate for heat dissipation by way of "holes" for semiconductor chip mounting formed in metal foil or a metal sheet. A printed circuit board is used in which the wiring network containing the above-mentioned holes are formed in one side or both sides of a metal base copper clad laminate in which prepreg or copper foil is superimposed. However, in this prior art example, the relationship between the metal foil in the side walls of the holes for mounting semiconductor chips or the height of the metal sheet and the thickness of the semiconductor chips is not defined. In addition, the configuration having taken into consideration heat dissipation of the semiconductor chips is not defined. Further, from the depth relationship of the holes for mounting semiconductor chips and the thickness of the semiconductor chips not being clear, consideration of thin-sizing is regarded to be insufficient. Also, from having to remove the glass cloth (described later) when the holes for mounting semiconductor chips in a printed circuit board are formed, the increased manufacturing cost is readily anticipated.

Japanese Laid-Open Patent Application (Kokai) (A) No. S64-012598 (1989) titled "IC CHIP MOUNTING MULTI-LAYER BOARD" discloses the use of a metal sheet with a thickness of 0.1-1.0 mm, preferably 0.2-0.5 mm, and with a thermal expansion coefficient of not more than $9 \times 10^{-6}$ cm/cm/° C. Although performing surface treatment suitably and improving the adhesive property is mentioned, these can also be considered similar problems (namely, consideration of thin-shaping is insufficient and increased manufacturing cost) relative to the seventh prior art example.

Japanese Laid-Open Patent Application (Kokai) (A) No. H02-122534 (1990) titled "HYBRID INTEGRATED CIRCUIT" discloses a means to provide a hybrid integrated circuit in which high current can flow and miniaturized high density mounting is made possible. The wiring pattern is formed with "openings" for mounting semiconductor chips in a thermoplastic resin plate, and further consists of semiconductor chips and a metal plate of the same thickness arranged on either side of the semiconductor chips. Also, the thermoplastic resin plate in which the wiring layer is formed in a multi-layer is united with another thermoplastic resin plate by means of thermocompression bonding. The lead terminals of the semiconductor chips are inserted in the openings provided between the thermoplastic resin plates formed in the multi-layer wiring layer and electrically connects with the wiring layer. However, in this prior art example, the measures relative to heat dissipation of the semiconductor chips are not clear. Also, the resin seal around the circumference of the semiconductor chips is problematic from thermocompression bonding with the thermoplastic resin plates in which the openings are formed and the thermoplastic resin plates with which the multi-layer wiring layer is formed. When thermocompression bonding is performed in the state of fusing the thermoplastic resin plates, fluctuation of the thickness between layers of the section which forms the multi-layer wiring layer can be anticipated, and electrical specification control can be presumed to be difficult.

Japanese Laid-Open Patent Application (Kokai) (A) No. 2002-111226 titled "COMPOSITE MULTILAYER BOARD AND MODULE FOR USING IT" disclosure is explained below.

FIG. 12A is a cross sectional plan view of the composite multi-layer substrate described in the official gazette. This composite multi-layer substrate 1 has a stacked multi-layer structure of a plurality of layers. The illustrated example has four layers (described later "resin layers") 2-5 which are composed of resin material. These resin layers 2-5 are common in that all use resin materials, such as epoxy, etc., for the material (so-called glass cloth 7) and only the layer of the resin layer 2 (drawing top layer) is different in the respect that a glass fiber 6 is contained within the braided (knitted) shape of a net as shown in FIG. 12B. The glass cloth 7 is reinforcement for enhancing the physical strength of the composite multi-layer substrate 1. For convenience of explanation hereinafter, while the resin layer 2 which "has" the glass cloth 7 is denoted as "glass cloth layer 2," the resin layers 3-5 which "do not have" the glass cloth 7 are denoted as "glass clothless layers 3-5."

Further, this composite multi-layer substrate 1 is bonded to copper foil on the bottommost surface (underside of the glass clothless layer 5) as the mounting side. The conductor pattern of copper foil is created by etching techniques, and the conductor pattern 8 of the required shape is formed. Also, some of the glass cloth layer 2 is eliminated wherein a concavity 9 (It is called a mold cavity whereas an opening is generally closed.) is formed and the electronic components 10 (for example, semiconductor chips) are mounted in the concavity 9.

The electronic components 10 "are embedded" by using the inner section of the composite multi-layer substrate 1. Accordingly, other components can be mounted to the composite multi-layer substrate 1 front surface along with components mounted in higher density.

However, since the invention described in the above-mentioned official gazette (tenth prior art example) uses the glass cloth 7 as reinforcement for enhancing the physical strength of the composite multi-layer substrate 1:

There is a problem of ion migration occurring relative to the interface of the glass fiber 6 and the resin (the main material of the glass cloth layer 2), whereby the insulation becomes destroyed depending on the intensity of the electrolysis and resultant deterioration in the electrical properties.

In order to form the concavity 9 for the mold cavity, it is necessary to physically remove some of the resin layer 2. In that case, the glass fiber 6 within the resin layer 2 must be severed. Although such a cutting operation commonly uses precision processing machines, such as laser, etc., truncation errors are undeniable and considerable production time is also required. Moreover, when a plurality of the concavity 9 is required, there is a problem that the production time proportionately increases which incurs higher manufacturing costs.

Therefore, the present invention's purpose is to prevent deterioration of the electrical characteristic accompanying the generation of migration and aiming at reduction of the manufacturing cost by using other reinforcement as a substitute for the glass cloth.

SUMMARY OF THE INVENTION

The present invention has been made in view of the conventional prior art drawbacks mentioned above. In accordance an aspect of the present invention in claim 1, there is provided a composite multi-layer substrate comprising a flat plate-like core member formed of a material having excellent electric conductivity, heat conductivity and high rigidity properties; a front side resin layer covering a front surface of said core member; a rear side resin layer covering a rear surface of said core member; a bottomless hole formed in said core member and said rear side resin layer penetrating a front and rear of said core member and a front and rear of said rear side resin layer; an electronic component mounted in said bottomless hole, the thickness of the electronic component being equal to or larger than the thickness of said core member; a height size adjustment member interposed among said electronic component and said core member and said rear side resin layer; and a column segment which divides said core member and penetrates said front and rear surfaces in a thickness direction of said core member; wherein said column segment is adapted to providing an electrical signal transmission path or a power supply voltage transmission path to the front and rear surfaces of said substrate.

In accordance with another aspect of the present invention in claim 2, there is provided a composite multi-layer substrate comprising a flat plate-like core member formed of a material having excellent electric conductivity, heat conductivity and high rigidity properties; a front side resin layer covering a front surface of said core member; a rear side resin layer covering a rear surface of said core member; a flat bottomed hole formed in an opening of either one of said front surface of said core member or said rear surface of said core member; an electronic component mounted in said flat bottomed hole, the thickness of the electronic component being equal to or larger than the thickness of said core member; a height size adjustment member interposed among said electronic component and said core member and said rear side resin layer; and a column segment which divides said core member and penetrates said front and rear surfaces in a thickness direction of said core member; wherein said column segment is adapted to providing an electrical signal transmission path or a power supply voltage transmission path to the front and rear surfaces of said substrate.

Here, the present invention is not limited in particular.

What is essential is just to have a combination of the three above-stated properties: "material which has excellent electrical conductivity, excellent heat conductivity and high rigidity."

According to the present invention, as the core member consists of "material which has excellent electrical conductivity, excellent heat conductivity and high rigidity," typically, a core member made from metal (metallic) is preferred, but copper, Alloy 42, Invar, etc. are particularly preferred.

Additionally, though each "bottomless hole" and "bottomed hole" are used to mount an electronic component (an electronic component is a general term of a passive component part, such as a semiconductor chip, a transistor, a resistance element, a capacitative element, an inductance element or other electronic components), the first is different in terms of a "a hole without a bottom (or a through hole)" and the latter "a hole with a bottom (or a concave portion)". Also, the opening shape of a "bottomless hole" and a "bottomed hole" should just have an appropriate shape (for example, a little higher shape than the outside of the electronic component) which can conveniently mount a target electronic component.

In a composite multi-layer substrate which has these characteristics, in order to have a core member which has rigidity, it is not necessary to use glass cloth as a reinforcing material. Therefore, various kinds of inconveniences (namely, aggravation of electrical properties by an accompanying generation of ion migration and the increased manufacturing cost accompanying the glass cloth cutting process) which accompany glass cloth are avoided.

In accordance with another aspect of the present invention in claim 3, there is provided a composite multi-layer substrate comprising a flat plate-like core member formed of a material having excellent electric conductivity, heat conductivity and high rigidity properties; a front side resin layer covering a front surface of said core member; a rear side resin layer covering a rear surface of said core member; a bottomless hole formed in said core member and said rear side resin layer penetrating a front and rear of said core member and a front and rear of said rear side resin layer; an electronic component mounted in said bottomless hole, the thickness of the electronic component being equal to or larger than the thickness of said core member; and a height size adjustment member interposed among said electronic component and said core member and said rear side resin layer; wherein said height size adjustment member is interposed between the bottom of said electronic component when said electronic component height size is lower than the depth size of said core member mounted in said bottomless hole, wherein said height size adjustment member is adapted to adjusting a height of said electronic component.

In accordance with another aspect of the present invention in claim 4, there is provided a composite multi-layer substrate comprising a flat plate-like core member formed of a material having excellent electric conductivity, heat conductivity and high rigidity properties; a front side resin layer covering a front surface of said core member; a rear side resin layer covering a rear surface of said core member; a bottomless hole formed in said core member and said rear side resin layer penetrating a front and rear of said core member and a front and rear of said rear side resin layer; an electronic component mounted in said bottomless hole, the thickness of the electronic component being equal to or larger than the thickness of said core member; and a height size adjustment member interposed among said electronic component and said core member and said rear side resin layer; and wherein said core member is patterned by applying a subtractive process.

In accordance with another aspect of the present invention in claim 5, there is provided a composite multi-layer substrate comprising a flat plate-like core member formed of a material having excellent electric conductivity, heat conductivity and high rigidity properties; a front side resin layer covering a front surface of said core member; a rear side resin layer covering a rear surface of said core member; a flat bottomed hole formed in an opening of either one of said front surface of said core member or said rear surface of said core member; an electronic component mounted in said flat bottomed hole, the thickness of the electronic component being equal to or larger than the thickness of said core member; and a height size adjustment member interposed among said electronic component and said core member and said rear side resin layer; wherein said core member is patterned by applying a subtractive process.

The above and further objects and novel features of the present invention will more fully appear from the following detailed description when the same is read in conjunction with the accompanying drawings. It is to be expressly understood, however, that the drawings are for the purpose of illustration only and are not intended as a definition of the limits of the invention.

BRIEF DESCRIPTION OF THE DRAWINGS

FIGS. 8A-8C are manufacturing process diagrams (fourth through sixth process) of a module 40;

FIGS. 10A-10D are manufacturing process diagrams (seventh through tenth processes) of a module 40;

DETAILED DESCRIPTION OF THE PREFERRED EMBODIMENTS

Hereinafter, the embodiments of the present invention will be explained with reference to the drawings.

Figure 1A:
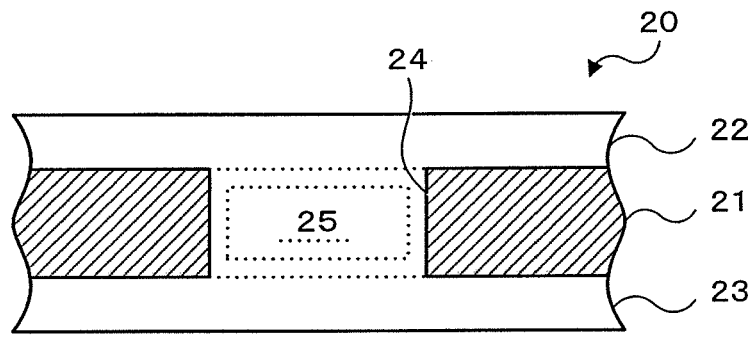
FIGS. 1A-1C are main cross sectional plan views and a main perspective view of a composite multi-layer substrate in the embodiment.
Figure 1B:
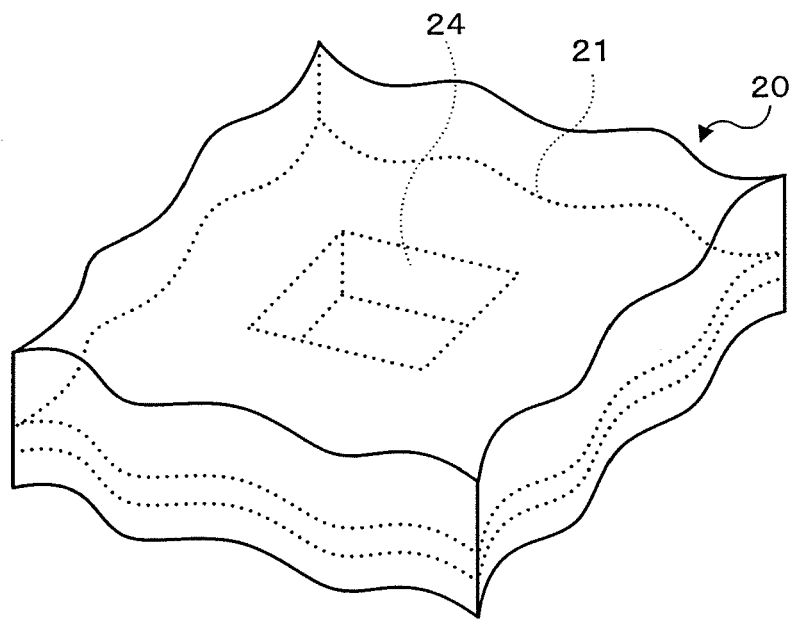
Figure 1C:
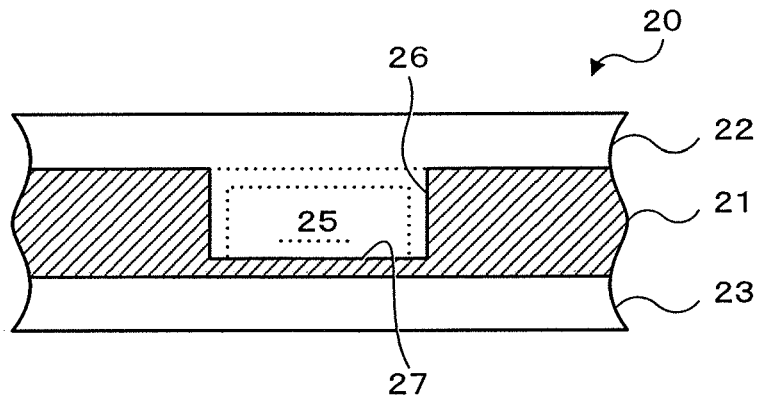

FIGS. 1A-1C are main cross sectional plan views and a main perspective view of a composite multi-layer substrate in the form of the embodiment. In this cross sectional view, the composite multi-layer substrate 20 has a "multi-layer structure." Referring to the example illustration, the composite multi-layer substrate 20 has a three-layer structure comprising a core member 21, a resin layer 22 (hereinafter "substrate front side resin layer") and a resin layer 23 (hereinafter "substrate rear side resin layer." The core member 21 in the shape of a flat plate-like board is composed of a material which has excellent electrical conductivity, excellent heat conductivity and high rigidity. The substrate front side resin layer 22 covers the front surface of the core member 21 (in the direction of the drawing, the upper surface). The substrate rear side resin layer 23 covers the rear surface of the core member 21 (in the direction of the drawing, the lower surface).

The essential physical characteristics for the core member 21 are the above-mentioned three: excellent electrical conductivity, excellent heat conductivity and high rigidity. "Excellent electrical conductivity" pertains to the property of a material that allows electricity to pass through easily (that is, electrical resistance is low). "Excellent thermal conductivity" pertains to the ability to convey heat easily (that is, thermal conductivity is high). "High rigidity" pertains to minimal stress deformations due to bending or compressing. The construction material is not limited. What is essential is just to have the above-mentioned physical characteristics. Typically, metal (metallic) is preferred and especially more preferable when metals such as Cu (copper), Alloy 42, Invar, etc., are used which simultaneously satisfy the above-mentioned three physical characteristics.

Additionally, the material of the resin layers (the substrate front side resin layer 22 and the substrate rear side resin layer 23) covering the front and rear of the core member 21 has electrical insulating and environmental capabilities (water resistant, acid resistant, etc.), and if required further has the necessary dielectric constant. An insulating material, for example, such as epoxy, polyimide, cyanate ester, Teflon (registered trademark), etc., used for a resin material or printed circuit boards can be used.

A through hole 24 (hereinafter "bottomless hole") of predetermined opening shape is formed in the core member 21 and penetrates the front and rear (refer to FIGS. 1A and 1B). The bottomless hole 24 is used as a mounting hole of an electronic component 25. Hence, an electronic component 25 is mounted (embedded) in the inner part of the composite multi-layer substrate 20 and improvement of high density packaging can be achieved.

Figure 12A:
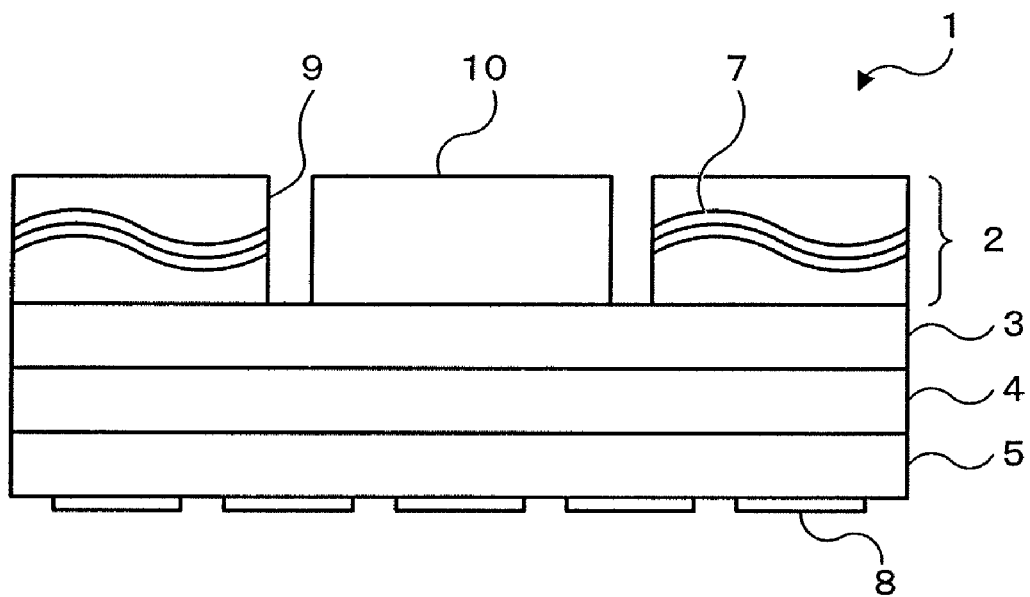
FIGS. 12A and 12B show a cross sectional plan view of a conventional prior art composite multi-layer substrate and an enlarged plan view of the glass cloth.
Figure 12B:
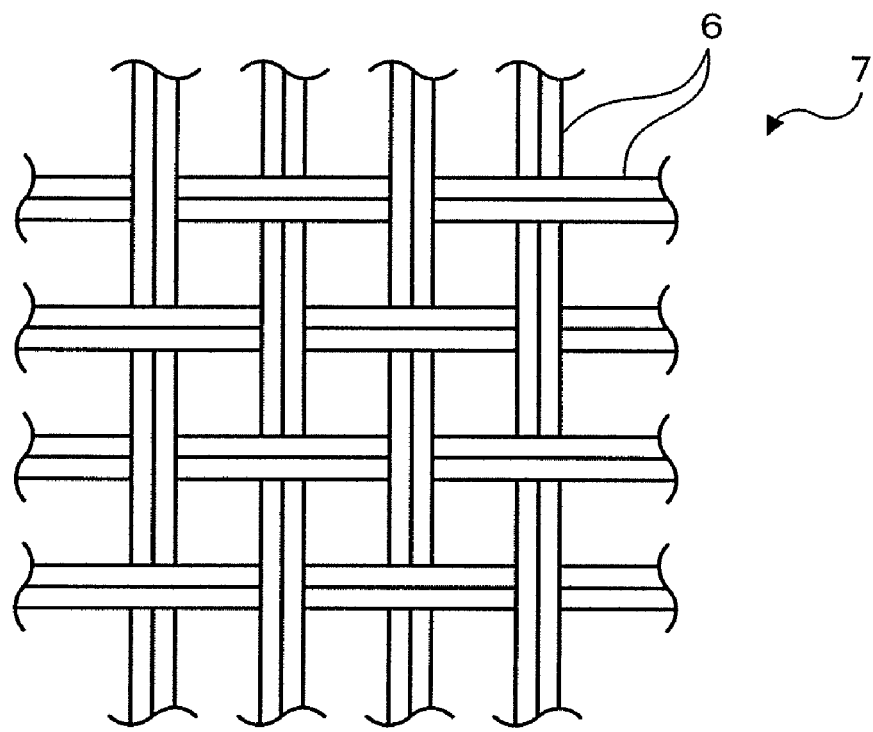

According to the composite multi-layer substrate 20 which has such a structure, physical strength (flexural rigidity, etc.) of the composite multi-layer substrate 20 can be acquired with the rigidity of the core member 21. Therefore, the reinforcing material (glass cloth 7; refer to FIG. 12) used in the past can be made redundant and various inconveniences related to the application of the glass cloth can be avoided.

Namely, as the core member 21 which has "high rigidity" at least uses other reinforcement material which replaces the glass cloth, the problem of ion migration explained earlier [Ion migration occurs relative to the interface of the glass fiber 6 front surface and the resin, whereby the insulation becomes destroyed and the electrical characteristic is deteriorated.]; and the problem of increased manufacturing cost [In order to form a bottomed hole 9 for a cavity, it is necessary to physically remove a portion of the resin layer 2. In that case, even though the inner part glass fiber 6 of resin layer 2 must be severed and such a cutting operation uses a precision processing apparatus, for example generally a laser, etc., a truncation error cannot be denied and considerable work hours are required. Moreover, when a plurality of the bottomed hole 9 is necessary, the number of needed work hours only redoubles which causes a rise in manufacturing cost.] can be solved.

Thus, the ultimate objects of the present invention (to avoid deterioration of the electrical characteristic accompanying generation of migration and to cutback the manufacturing cost) can be achieved.

In addition, although the above explanation showed an example of mounting an electronic component 25 in the bottomless hole 24 formed in the core member 21, an electronic component mounting hole does not necessarily have to be a hole (namely, a bottomless hole) which "penetrates front and rear." For example, as shown in FIG. 1C, a concave portion 26 (hereinafter "flat bottomed hole") may be formed in the core member 21 and an electronic component 25 can be mounted in a bottomed hole 26. In this manner, by direct contact or via heat conductive adhesive, etc. between an electronic component 25 and the base 27 of a flat bottomed hole 26, etc., the heat generated by an electronic component 25 can efficiently escape to the core member 21. Thus, the core member 21 can be used for heat dissipation of an electronic component 25.

Also, it is desirable to presume that the resin layer structure (selection of materials, thickness of layer, etc.) for the front and rear surface sides of the core member 21 be approximately the same. The composite multi-layer substrate 20 front and rear surfaces are made into a symmetrical structure. Because the resin layers on the front and rear surface sides (front side resin layer 22 and rear side resin layer 23) of the core member 21 lessen differential thermal expansion, "curvature" of the composite multi-layer substrate 20 can be controlled.

As stated above, even though the front and rear surface sides of the core member 21 are each covered by the front side resin layer 22 and the rear side resin layer 23, it is desirable when the sides of the core member 21 are also covered by resin, etc. That is, it is desirable to completely enclose (sealant or coating) "all the surfaces" of the core member 21 with an environmentally resistant material equivalent to resin or thereto. Since the front and rear surfaces of the core member 21 each covered by the front side resin layer 22 and the rear side resin layer 23 are not unprotected to ambient air, there is no concern about oxidation. However, when the sides of the core member 21 are exposed, there is a possibility that the surfaces may oxidize gradually and generate an electrical short circuit, etc. causing a malfunction between the mounted components adjoining this exposure.

Figure 2A:
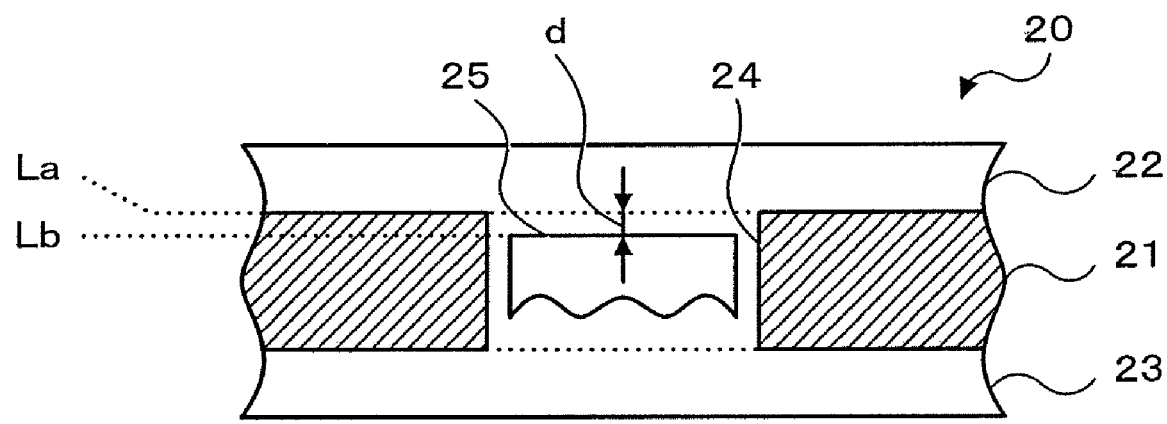
FIGS. 2A and 2B are composition diagrams when mounting an electronic component 25 in a bottomless hole 24 of the core member 21.
Figure 2B:
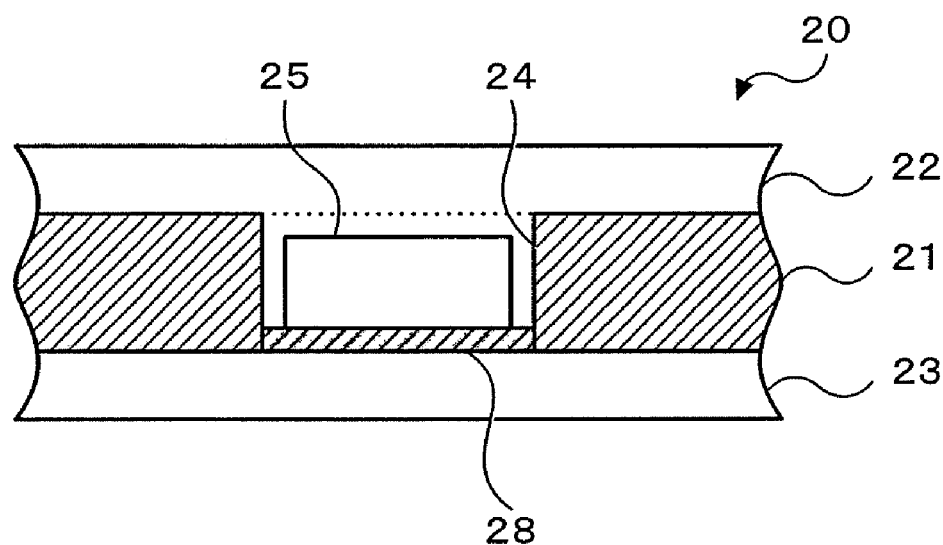

FIGS. 2A and 2B are composition diagrams when mounting an electronic component 25 in a bottomless hole 24 of the core member 21. Referring to FIG. 2A, when the upper surface height position of the core member 21 is assumed to be La and the upper surface height position of an electronic component 25 is assumed to be Lb, as for the differential d (d=La−Lb) of the height, it is desirable to formulate a value of zero or more than zero (namely, La=Lb or any relation of La>Lb). In this manner, since the upper surface height position La of the core member 21 constitutes a position always higher than the upper surface height position Lb of an electronic component 25, it can respond to the loading (load added when the front side resin layer 22, etc. is laminated) to an electronic component 25 on the core member 21 at the time of manufacturing the composite multi-layer substrate 20 and damage to an electronic component 25 is avoidable.

FIG. 2B is a composition diagram when mounting the electronic component 25 in a bottomless hole 24 of the core member 21. The variation in FIG. 2B places a thermally conductive resin 28 interposed between an electronic component 25 and the rear side layer 23 which are in contact with a side edge of the thermally conductive resin to the internal surface of a bottomless hole 24 of the core member 21. In this manner, the heat generated by an electronic component 25 can be dissipated efficiently to the core member 21 from the internal surface of a bottomless hole 24 via the thermally conductive resin 28.

Figure 3A:
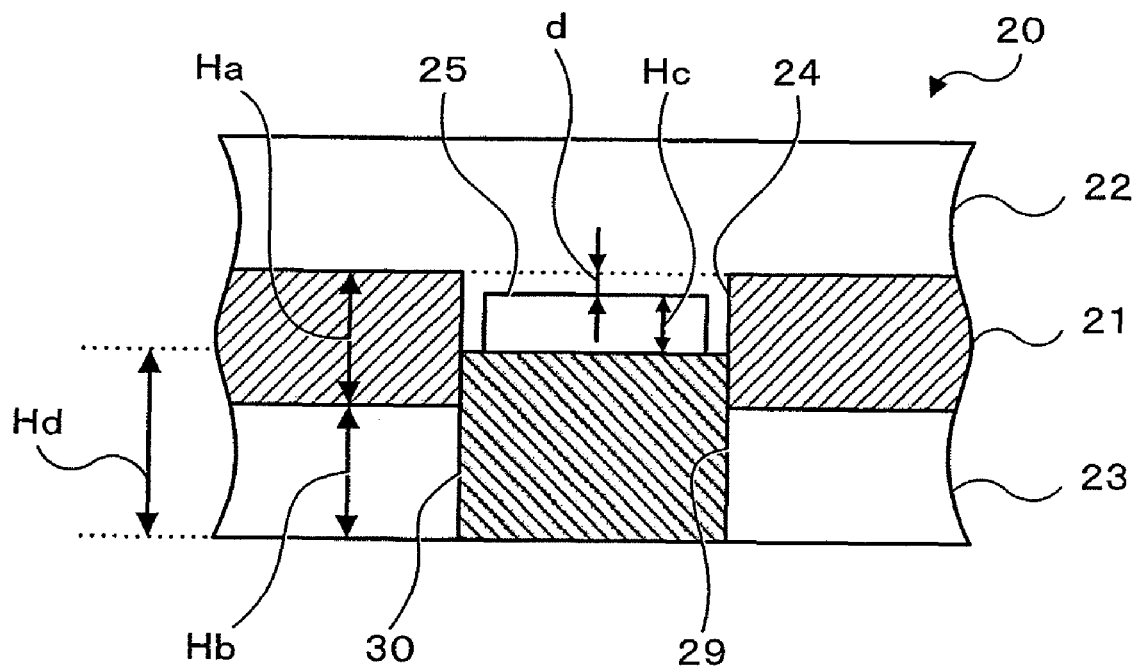
FIGS. 3A and 3B are composition diagrams when mounting an electronic component 25 in a bottomless hole 24 of the core member 21.

Furthermore, FIG. 3A is a composition diagram when mounting an electronic component 25 in a bottomless hole 24 of the core member 21. The variation in FIG. 3A places a bottomless hole 29 also in the rear side resin layer 23 loaded with a height size adjustment member 30 which constitutes two bottomless holes 24, 29 from good thermally conductive material (for example, copper, etc.) and an electronic component 25 is placed and mounted on this height size adjustment member 30.

Here, when calculating the depth size Ha of the core member 21, the height size Hb of the resin side layer 23 and the height size Hc of the height size adjustment member 30, in order to adjust the differential d of the height of the upper surface position La of the core member 21 and the upper surface height position Lb of an electronic component 25 to the desired value, it only has to satisfy the relation of:

$$Ha+Hb=Hc+Hd+d \quad (1)$$

because Ha, Hb and Hc are fixed values. For example, in order to make d=0:

$$Ha+Hb=Hc+Hd \quad (2)$$

Therefore, height Hd of the height size adjustment member 30 is suitable as:

$$Hd=Ha+Hb-Hc \quad (3)$$

Based on this, even if it is a case that the height size Hc of an electronic component 25 is extremely small as compared with the depth size Ha of the core member 21, the above-stated size differential d can be readily set to a desired value and various electronic components with different height sizes can be conveniently embedded in the composite multi-layer substrate 20. Also, if good thermally conductive material is used as the height size adjustment member 30, heat generated by an electronic component 25 can be dissipated from the height size adjustment member 30 to the core member 21 via the internal surface of a bottomless hole 29. Further, heat can be dissipated also to the exterior from the underside of the height size adjustment member 30 and the heat dissipation effect of an electronic component 25 can be improved much more.

Figure 3B:
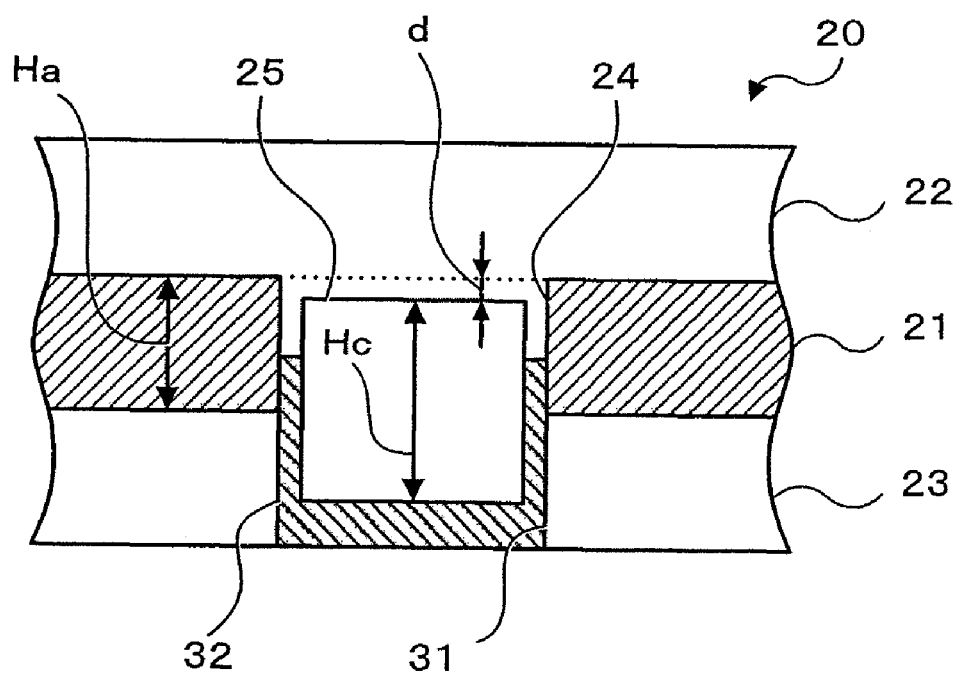

FIG. 3B is a composition diagram when mounting an electronic component 25 in a bottomless hole 24 of the core member 21. The variation in FIG. 3B makes it possible to apply an electronic component 25 with a large height size. Referring to FIG. 3B, the height size Hc of an electronic component 25 exceeds the depth size Ha of the core member 21 (Ha<Hc). This electronic component 25 is mounted on both sides of a bottomless hole 24 formed in the core member 21, a bottomless hole is formed in the rear side resin layer 23. A portion of the underside of an electronic component 25 and the sides are held via a thermally conductive resin 32 in two holes (a bottomless hole 24 and bottomless hole 31).

In this manner, even if an electronic component 25 has a large height size, the above-stated size differential d can be readily set as the desired value. Heat generated by an electronic component 25 can be dissipated from the thermally conductive resin 32 to the core member 21 via the internal surface of a bottomless hole and can also be dissipated from the underside of the thermally conductive resin 32 to the exterior. Thus, the heat dissipation effect of an electronic component 25 can be improved still more.

Figure 4A:
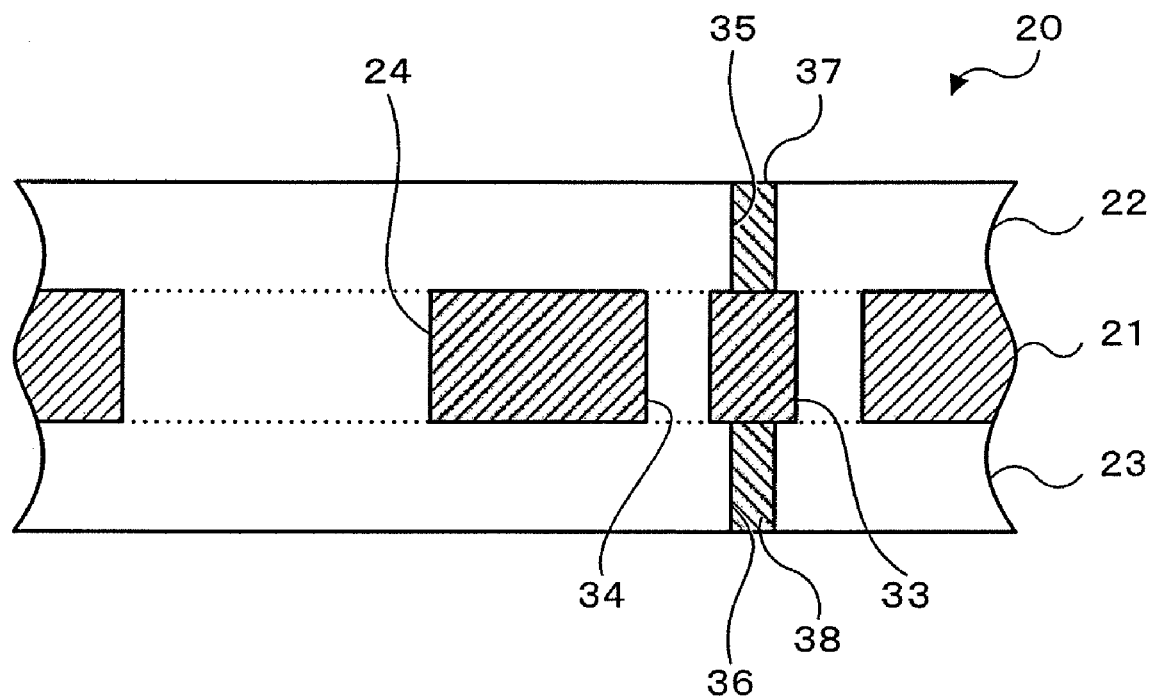
FIGS. 4A and 4B is a main cross sectional plan view in another section of the core member 21 and an external perspective view of the section.
Figure 4B:
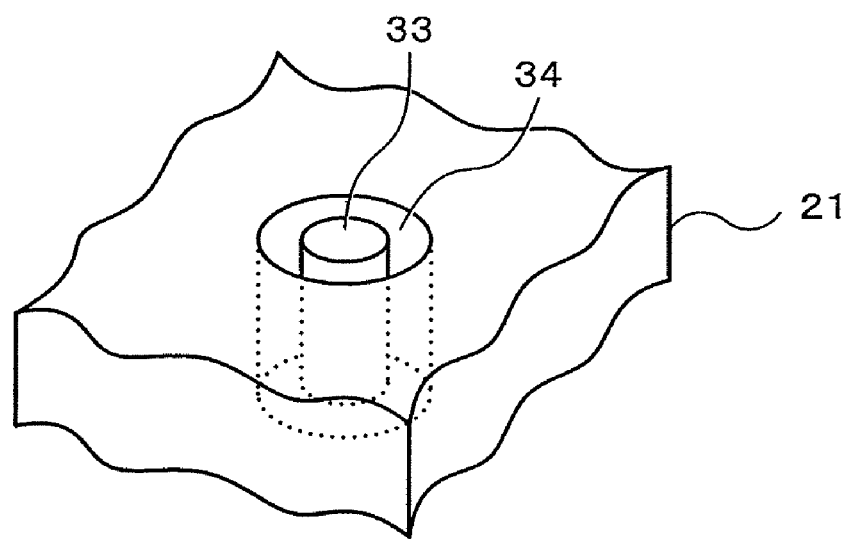

FIGS. 4A and 4B is a main cross sectional plan view in another section of the core member 21 and an external perspective view of the section. Referring to these drawings, a column segment 33 is set in an optional position (although adjacent to a bottomless hole 24 in the drawing, it is not limited to this) of the core member 21.

The column segment 33 is originally a portion of the core member 21. Specifically, it is a "remaining part" of the core member 21 produced by having formed a cylindrical dividing groove 34 in an optional position of the core member 21. A column segment 33 can be used as follows. Namely, when a via hole 35, 36 is formed in both the front side resin layer 22 and the rear side resin layer 23 and an electrode 37, 38 is formed in the via hole 35, 36 in both directions of one end side and the other end side of the column segment 33 (island-shaped sections), the electrode 37, 38 are electrically connected via a column segment 33. Furthermore, because the end face of each of the electrode 37, 38 is exposed to the front and rear surfaces of the composite multi-layer substrate 20, the electrode 37, 38 and the column segment 33 can be used as double-sided penetration wiring of the composite multi-layer substrate 20. Thus, an electrical signal or power supply voltage transmission path can be obtained.

Figure 5:
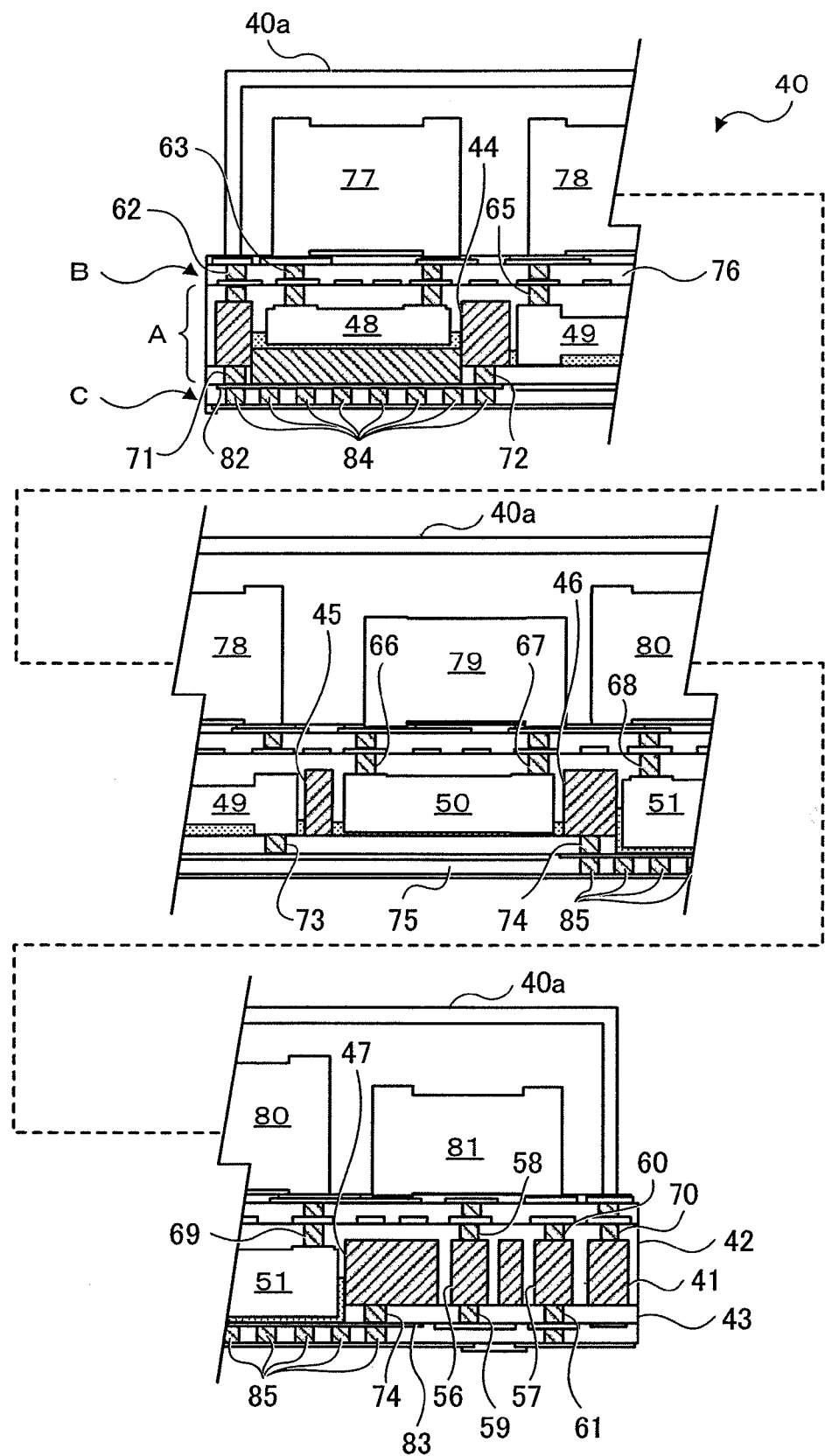
FIG. 5 is a cross sectional plan view of a module 40 applied to the present invention.

FIG. 5 is a cross sectional plan view of a module 40 applied to the present invention.

A "module (the United Kingdom: module)" signifies "a standardized unit." Although a module is interpreted as a type of unit or component, a unit is usually situated as an exchangeable integrant part. A module does not assume replacement parts being situated as a minimum configuration module by itself and further is designed and manufactured as an apparatus with a specific function in most cases. However, since in actuality that precise categorization is not defined, in the description it is assumed that this terminology ("module") is defined as follows. Namely, a module which can be said to comprise one or more (a combination of electronic components of different kinds is included) electronic components (these are named generically and called an "electronic component") of a semiconductor chip, a resistance element, a capacitative element or others are mounted in the inner sections and a necessary electronic circuit function is actualized, as well as an apparatus which can be distributed individually in the marketplace. Subsequent replacement simplicity including (installing) optional electronic devices is not especially considered. It may have a mounting configuration which can be attached and detached by a connector, etc. and may be formed mounted mostly in a fixed state by soldering, etc.

A module 40 as shown in FIG. 5, for example, can function as a power amplifier module which is an integral part of an Radio Frequency (RF; high-frequency wave) section in a portable telephone or a Personal Digital Assistant (PDA) with a wireless communications device, an antenna switch module or an RF module which unifies these and can be distributed in the marketplace by itself as a product.

A module 40 actualizes desired circuitry (a power amplifier module, an antenna switch module or an RF module that unified these) by mounting the necessary electronic components in the front surface and inner section of a composite multi-layer substrate having a structure which applies the technical concept of the above-mentioned embodiments (first through third embodiments).

As shown in FIG. 5, the module 40 structure can be roughly divided into an intermediate layer A, a upper rank layer B laminated to the intermediate layer A upper surface, and a lower rank layer C laminated to the intermediate layer A lower surface.

The intermediate layer A is laminated to a front side resin layer 42 and a rear side resin layer 43 respectively to both sides of a core member 41. A plurality (cross sectional plan view shows four) of bottomless holes 44-47 are formed in the core member 41 and has a structure embedded with suitable electronic components 48-51 for each of the bottomless hole 44-47.

Next, as an explanation for convenience, assume the electronic component 48 on the left end is a semiconductor chip with a short height size, the electronic component 49 which is second from the left is a capacitor (the height size is the depth size level of the core member 41), the electronic component 50 which is third from the left is a resistor (the height size is the depth size level of the core member 41) and the electronic component 51 is a semiconductor chip with a tall height size.

The electronic component 49, 50 with a height size about the depth size of the core member 41 are embedded and mounted in the bottomless hole 45, 46 respectively. As stated above, the electronic component 49, 50 are a capacitor and a resistor respectively. Since these components generate relatively little heat, the limitations of particular heat countermeasures are not required. An adhesive 52, 53 may be filled in between the rear side resin layer 43 to perform adhesion of the electronic component 49, 50. When heat generation of the component is severe, a good heat conductor should be used for the adhesive 52, 53 respectively.

Moreover, if it is the electronic component 48 with a short height size, a height size adjustment member 54 is put in and the height size is adjusted. When heat generation of the electronic component 48 is severe, a good heat conductor is used for the material of the height size adjustment member 54. Further, if it is the electronic component 51 with a tall height size, the height size is adjusted by embedding so that the rear side resin layer can be reached. When heat generation of the electronic component is severe, the sides and underside of the electronic component 51 are covered and laminated with a thermally conductive resin 55. In any case, the height size adjustment member 54 and a thermally conductive resin 55 which borders the portion of the core member 41 and the portion of the base section exposed from the intermediate layer A underside.

Besides, a column segment 56, 57 is set in an optional position of the core member 41. Also, the column segment 56, 57 constitute signal transmission paths or power supply transmission paths which penetrate the intermediate layer A front and rear with an electrode 58, 59, 60, 61 established so as to connect to both sides. In the intermediate layer A, 62-75 are electrodes.

The lower rank layer C forms an electrode pattern (described later in detail) of the required shape in both sides of a resin layer 76 and the upper rank layer B also forms an electrode pattern (described later in detail) of the required shape in both sides of a resin layer 77. Also, surface mounting of an electronic component 78-82 is performed on a predetermined electrode pattern. A covering cover 40a (desirable for functioning as electromagnetic shielding for EMI measures) is attached for the electronic component 78-82. Although not limited in particular, the electronic component 78, 79 and 81 is a capacitor and the electronic component 80, 82 is a resistor.

Thus, the module 40 uses a plate-like core member 41 consisting of material (Cu (copper), Alloy 42, Invar, etc.) having excellent electrical conductivity, excellent heat conductivity and high rigidity, as well as a structure built up with the resin layers 76, 77 in the front and rear surfaces of the core member 41. Here, the two resin layers 76, 77, for example, are both made with a resin, such as epoxy, polyimide, polycyanate ester, Teflon (trademark), etc. as the main ingredients (functional powder, such as dielectric powder and magnetic substance powder mixed in by desire is also good) or an insulating material used for a printed circuit board can be used. The characteristic is in the point of view (namely, the point of view which is a glass cloth less layer) of not having a glass cloth 7 (referring to FIG. 12) explained at the beginning. As the flexural rigidity of the module 50 is obtained by the core member 41 which mainly has an intermediate layer A base, it does not require the glass cloth 7 as reinforcing material.

The four cavities (those which form the bottomless hole 44-47) of the core member 41, a semiconductor chip (electronic component 48, 51), a capacitor (electronic component 49) and a resistor (electronic component 50) are each embedded. Then, among those electronic components which generate a large amount of heat (electronic component 48, 51), the bottom portion of each component and side surfaces (when required) are each connected to the core member 41 via a good thermally conductive material (height size adjustment member 54 and thermally conductive resin 55) and also connected with the upper surface electrode pattern 82, 83 of the lower rank layer C. The core member 41 dissipates via the internal surface of the bottomless holes. Furthermore, an electronic device substrate which mounts the module 40 will dissipate heat via the underside of an electrode pattern 86 of the lower rank layer C. Thus, sufficient heat dissipation can be acquired.

Additionally, as for a semiconductor chip (electronic component 48) with a short height size with the height size adjustment member 54 (An independent member or built up with plating. It has excellent heat conductivity and the height size adjustment of the electronic component 48 is carried out.) which is placed in a cavity (Those which are formed in the bottomless hole 44 of the core section 41 and a through hole of the same position.) formed in the lower rank layer C, it can be raised to a mounting height in the desired position and the relation (refer to the relation of La and Lb of FIG. 2) between the upper surface height position of the electronic component 48 and the upper surface height position of the core member 41 can be maintained appropriately.

As for a semiconductor chip with a tall height size (electronic component 51), the relation (refer to the relation of La and Lb of FIG. 2) between the upper surface height position of the electronic component 51 and the upper surface height position of the core member 41 can be maintained appropriately by placing an electronic component into a cavity (those which are formed in the bottomless hole 47 of the core part 41 and a through hole of the same position) formed in the lower rank layer C.

Patterning (formation of the bottomless hole 44-47 or the column segment 56, 57) in the intermediate layer A of the core member 41 should be performed in the state where the rear side resin layer 43 emulates the underside of the core member 41.

Because of the "island" shaped sections which are not removed in particular, the sections can be used as the column segment 56, 57 when the core member 41 is patterned in this state. Therefore, a columnar structure (what is called a "mailbox": those which are formed of the electrode 58, 59, 60 and 61 connected with the column segment 56, 57 to both ends) for connecting the front and rear of the intermediate layer A can be readily formed by physical processing (for example, etching) of the core member 41. When etching the core member 41 with a common etchant, such as Ferric Chloride, etc., the core member 41 material can be made from Cu (copper), Alloy 42, Invar, etc. from a relation of physical properties. However, when Alloy 42 and Invar are selected, it is preferred to perform Cu plating to the front surface of Alloy 42 or Invar from the prevention standpoint of ion migration, etc.

Figure 6A:
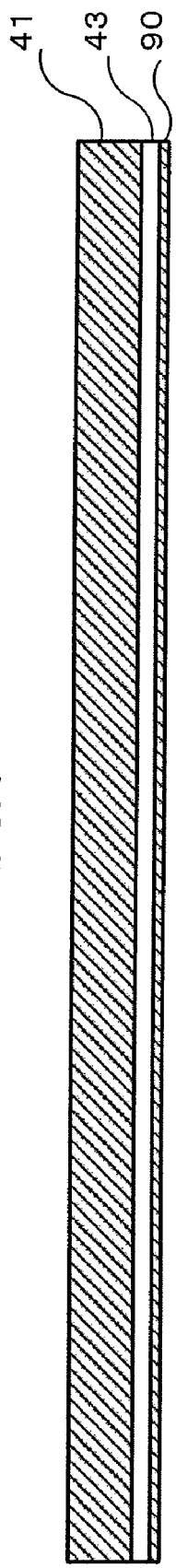
FIGS. 6A-6C are manufacturing process diagrams (first through third processes) of a module 40.

Next, the manufacturing process of the above-stated module 40 will be explained, with reference to FIG. 6A.

A plate-like core member 41 having excellent electrical conductivity, excellent heat conductivity and high rigidity comprising, a laminated resin layer (rear side resin layer 43) on the underside (referring to the upper and lower side directions in the drawing) of core member 41, for example, Cu, Alloy 42 or Invar, etc. and further, a thin film 90 having excellent electrical conductivity, excellent heat conductivity and high rigidity on the underside of the rear side resin layer 43 is glued together.

Here, as the material of the rear side resin layer 43, an insulating material, for example, such as epoxy, polyimide, cyanate ester, Teflon (registered trademark), etc. used for a resin material or printed circuit boards can be used. Also, as for the thin film 90 having the above-mentioned characteristics, typically copper foil can be used.

Basically, solutions which unify the rear side resin layer 43 and the thin film 90 may be used. For example, an apparatus which uses copper foil with resin or copper foil glued together to dry film can be used.

Figure 6B:
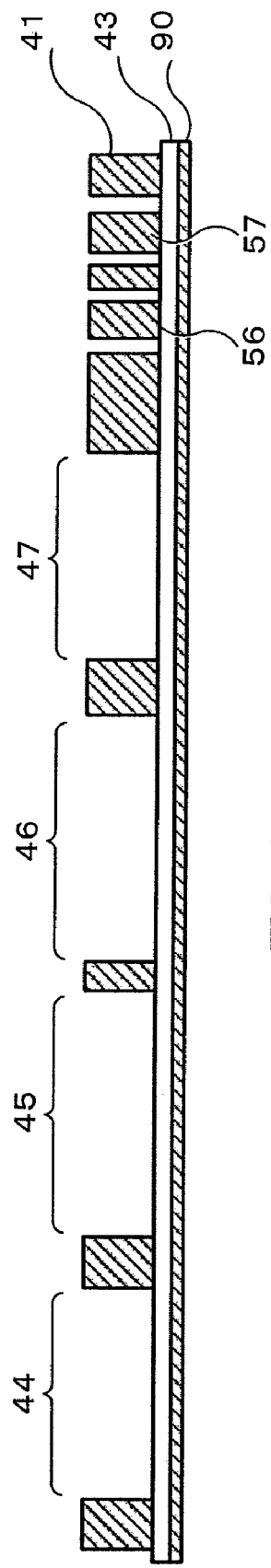

Next, with reference to FIG. 6B, the core member 41 is patterned and the bottomless hole 44-47 and the column segment 56, 57 are formed. The bottomless hole 44-47 each constitute a cavity for embedding the electronic component 48-51. Patterning of the core member 41 can be carried out, for example, by applying a subtractive process. In this case, an etchant current used with ordinary printed circuit boards, such as Ferric Chloride or Cupric Chloride (acid based) etchant, etc. can be used.

Figure 6C:
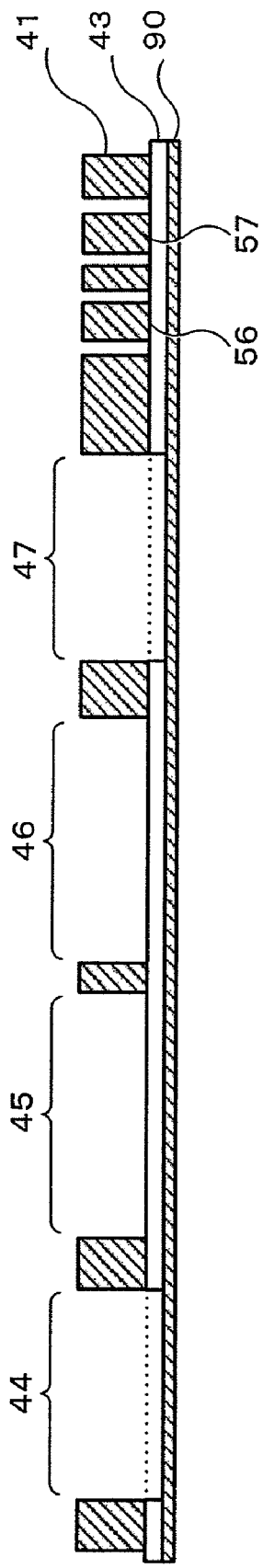

Next, with reference to FIG. 6C, as for the bottomless hole 44, 47 corresponding to the electronic component (electronic component 48, 51) which generate a large amount of heat, the rear side resin layer 43 underneath is removed in the same opening shape as the bottomless hole 44, 47 (refer to the dotted line section) and the thin film 90 is exposed. Removal of the rear side resin layer 43, for example, can be carried out, for example, by laser abrasion, plasma etching, etc.

Figure 7A:
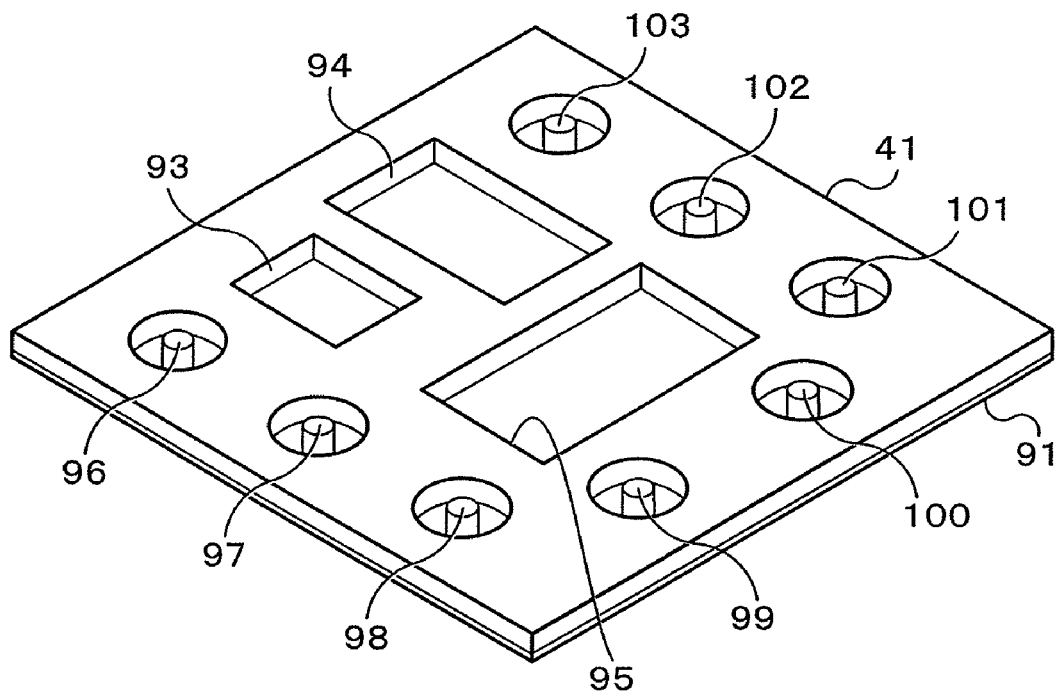
FIGS. 7A and 7B are outline views after the third process.
Figure 7B:
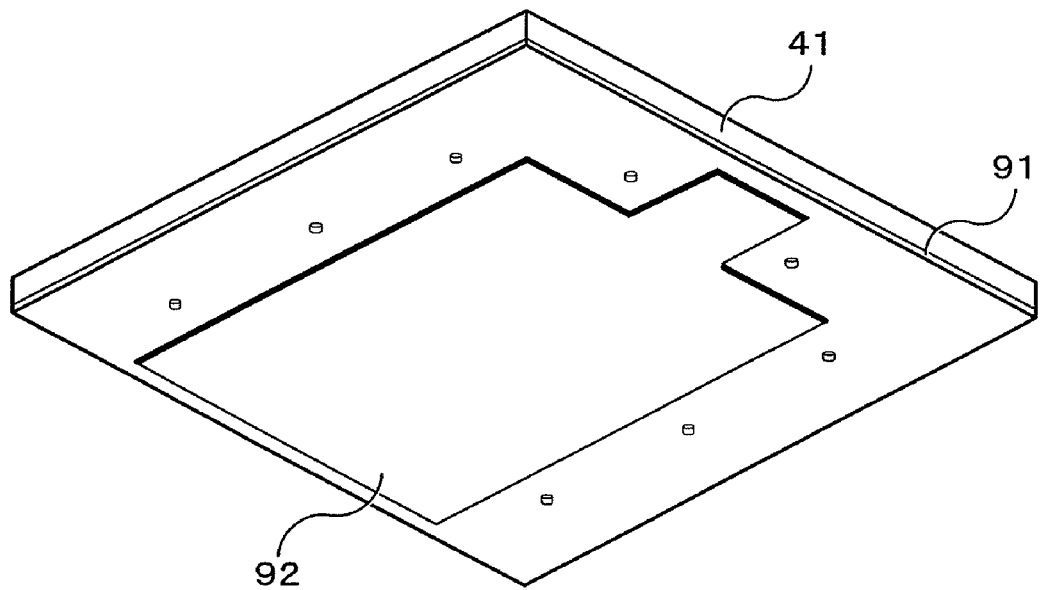

FIG. 7 shows outline views after the third process in which FIG. 7A illustrates the upper surface side perspective view and FIG. 7B is the lower surface side perspective view. Also, FIG. 7 and the above-stated process diagrams (FIG. 6A-6C) do not strictly correspond. The points of view that should be understood in FIG. 7 are the "cavities" and the "mailbox" which are formed in the core member 41. Accordingly, as shown in FIGS. 7A and 7B, the resin layer 91 (equivalent to the rear side resin layer 43 of FIG. 6) and copper foil 92 (equivalent to the thin film 90 of FIG. 6) are glued together on the underside of the core member 41. The core member 41 is patterned with several of the cavity 93-95 (equivalent to the bottomless hole 44-47 in FIG. 6) and several mailbox 96-103 (equivalent to the column segment 56, 57 in FIG. 6) are formed.

Next, with reference to FIG. 8A, the height size adjustment member 54 is inserted into the bottomless hole 44 on the left end and thermally conductive resin 104 is applied to the height size adjustment member 54. Moreover, the adhesive 52, 53 is applied to the second and third of the bottomless hole 45, 46 from the left and further the thermally conductive resin 55 is applied to the right end bottomless hole 47. The height size adjustment member 54 may be independent (standalone) or may be built up with plating, such as Cu, etc. It only has to have excellent heat conductivity and be able to perform height size adjustment of the electronic component 48. As the name suggests, the thermally conductive resin 104, 55 has a function which performs temporary fastening of the embedded electronic component 48, 51 while also having a heat dissipation effect. The adhesive 52, 53 only need to have a function which mainly fixes (bonds) the embedded electronic component 49, 50.

Here, although the electronic component 49, 50 which do not require particular heat dissipation countermeasures are fixed with the adhesive 52, 53, the embodiment is not limited to this. For example, in the case of the first process (FIG. 6A), lamination is completed wherein non-hardened sections remain without performing a full cure of the resin layer when the core member 41 and the resin layer (rear side resin layer 43) are glued and laminated. In the case of the electronic component 49, 50 mounted in the fourth process (FIG. 8A), it is possible to fix the electronic component 49, 50 by making each a high temperature case and recovering some viscosity of the resin layer. When performed in this manner, the adhesive 52, 53 coating operation can be considered unnecessary.

Next, with reference to FIG. 8B, the electronic component 48-51 respectively corresponding to each of the bottomless hole 44-47 are mounted. As for the first electronic component 48 wherein heat dissipation is necessary, heat can be dissipated to the core member 41 and the thin film 90 via the thermally conductive resin 104 and the height size adjustment member 54. Also, as for the second electronic component 51 wherein heat dissipation is necessary, heat can be dissipated to the core member 41 and the thin film 90 via the thermally conductive resin 55.

Next, with reference to FIG. 8C, after mounting the electronic component 48-51, the core member 41 is encapsulated by a resin. By means of this sealing, the front side resin layer 42 in the first through third embodiments is formed and the crevices surrounding the front surface of the core member 41, cavities (bottomless hole 44-47) and through mailboxes (column segment 56, 57) are completely covered by the front side resin layer 42. Here, it is desirable to also encapsulate completely in resin the side edges (refer to the dotted line enclosure parts A and B in FIG. 8C) of the core member 41. As a resin which encapsulates the side edges, although it may function as a portion of the front side resin layer, the side resin layer may be set in another body with the front side resin layer. When produced in such a manner, all the surfaces of the core member 41 are insulated from the environmental atmosphere (air) and oxidation of the core member 41 by oxygen, moisture, etc. in the environment can be prevented. Also, electrical short circuits between adjacent mounted components, etc. is prevented and malfunctioning can be avoided.

Here, as for the material of the front side resin layer 42, an insulating material, for example, a resin material, such as an epoxy, polyimide, cyanate ester, Teflon (registered trademark), etc. for printed circuit boards can be used.

Figure 9A:
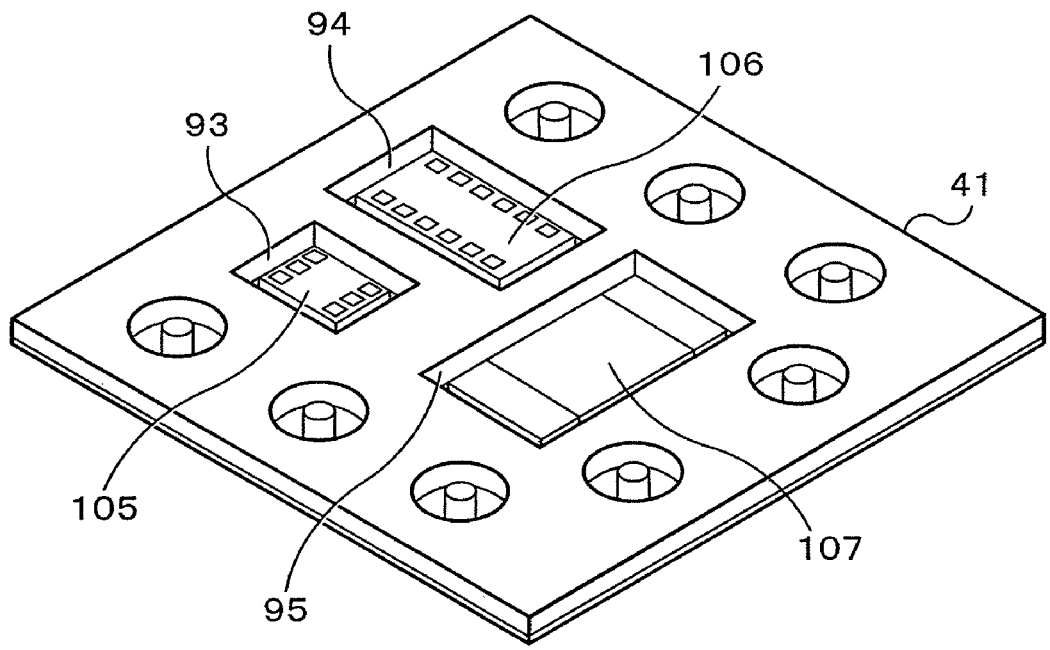
FIGS. 9A and 9B are outline views after the fifth and sixth processes.
Figure 9B:
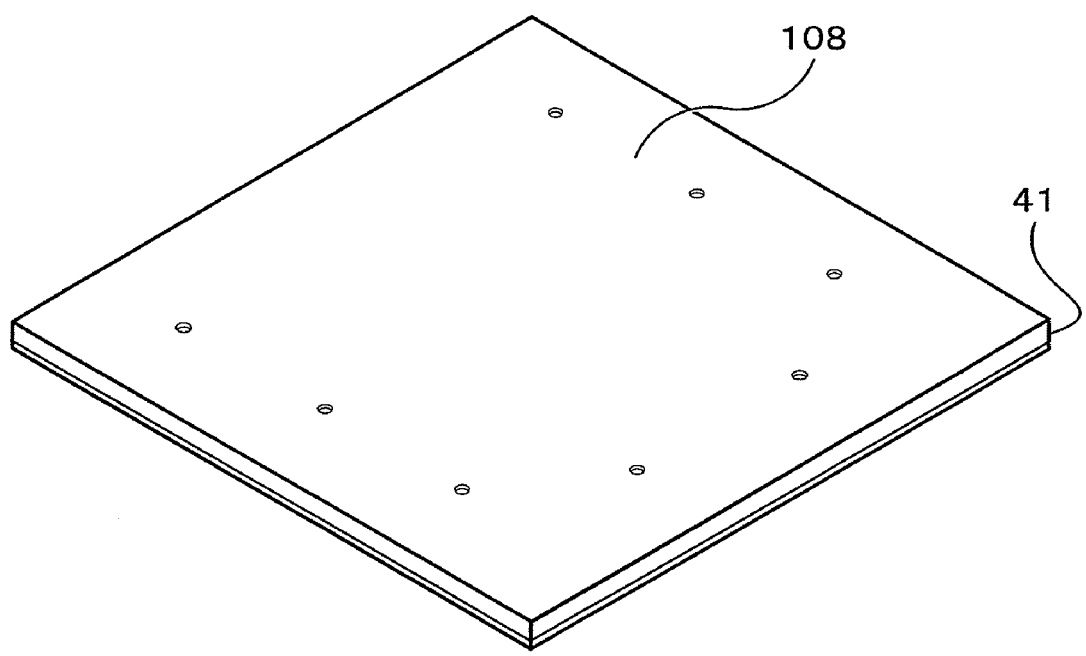

FIGS. 9A and 9B are outline views after the fifth process and after the sixth process respectively. Also, FIG. 9 and the above-stated process diagrams (FIG. 8A-8C) do not strictly correspond. The point of view that should be understood in FIG. 9 is the mounted state of the electronic components to a "cavities" formed in the core member 41 and the sealed state by means of a resin (front side resin layer 42). Accordingly, as shown in FIG. 9, the electronic component 105-107 (equivalent to the electronic component 48-51 of FIG. 8) are mounted correspondingly in each of the cavity 93-95 formed in the core member 41. The core member 41 in the state whereby the electronic components 105-107 are mounted is completely encapsulated by a resin 108 (equivalent to the front side resin layer 42 of FIG. 8). In FIG. 9B, for convenience of the diagram, the sides of the core member 41 after encapsulating by a resin 108 are exposed. The sides are also actually covered completely by the resin 108.

Next, with reference to FIG. 10A, the thin film 90 is patterned. By this patterning, the heat dissipation pattern 83 for dissipating direct heat to the thin film 90 via thermally conductive resin 55 among the electronic component 48, 51 which require heat dissipation countermeasures is formed. That is, etching of the thin film 90 is performed so that the heat dissipation pattern 83 remains.

Next, with reference to FIG. 10B, the small holes 109-125 are made in each of the front side resin layer 42 and the rear side resin layer 43. For example, after partially removing each class of resin by a Carbon Dioxide (CO2) gas laser, Ultra Violet (UV) laser or excimer laser, etc., a small hole 109-125 is formed by removing the residual substance of the resin by permanganic acid, plasma ashing, etc.

Next, with reference to FIG. 10C, coppering and etching are performed to the small holes 109-125, an electrode 62-75 for performing the interlayer electric connection with terminals of the electronic component 48-49, an electrode 58-61 for carrying out interlayer connection through the core member 41, etc. are formed. When necessary, in order to ensure the best adhesion of a resin and plating copper, the resin front surface may be roughened by permanganic acid, etc. and enhancement processing of the surface areas may be performed. Also, 126-154 are an electrode or a circuit pattern which are formed in each exposed surface of the front side resin layer 42 and the rear side resin layer 43. The intermediate layer A in FIG. 5 is produced by this tenth process.

Next, with reference to FIG. 10D, the upper rank layer B and the lower rank layer C in FIG. 5 are formed by lamination in resin of each of the front side resin layer 42 and the rear side resin layer 43 and by forming a necessary solder resist pattern for the front and rear of those resin.

Figure 11A:
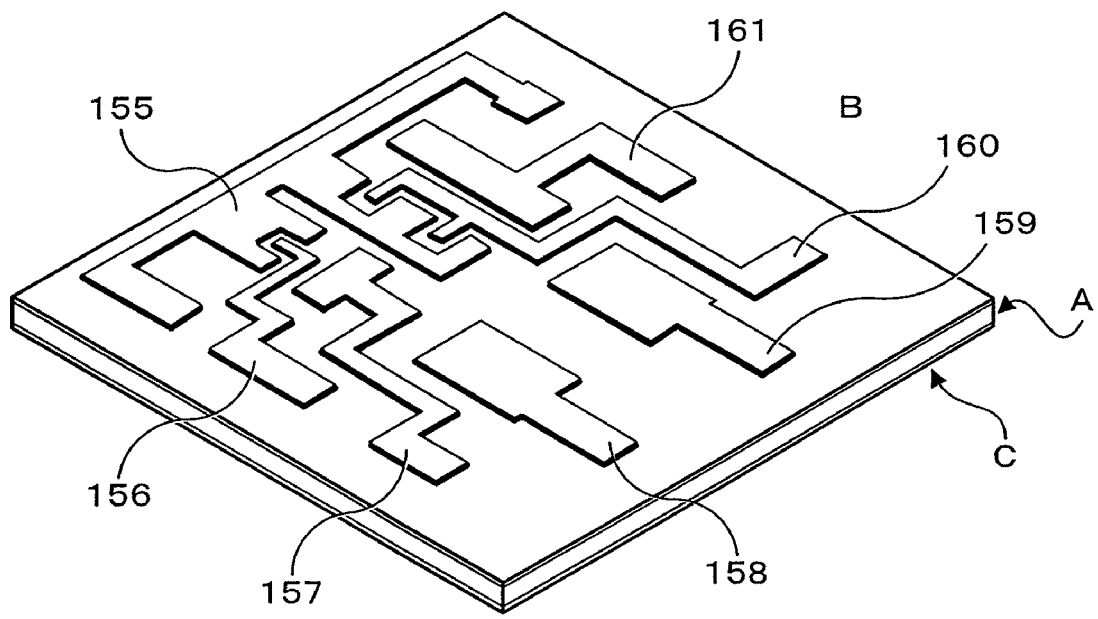
FIGS. 11A and 11B are outline views after the tenth process.
Figure 11B:
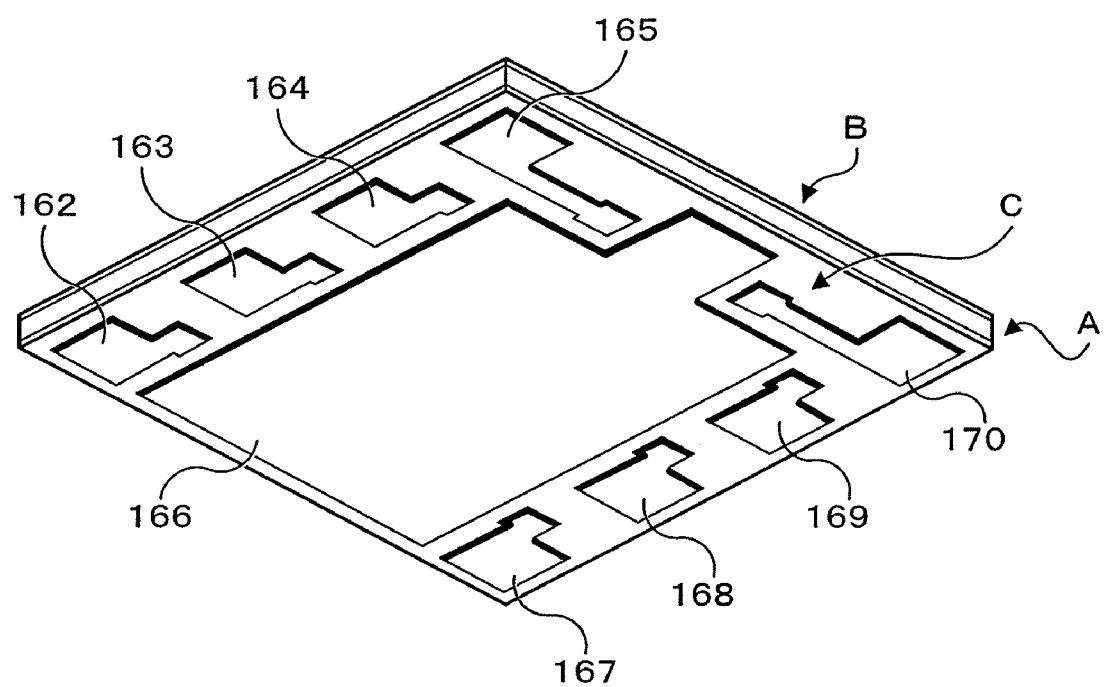

FIGS. 11A and 11B are outline views after the tenth process which illustrates an upper surface side perspective view and an underside perspective view respectively. The point of view that should be understood in FIG. 11 is the upper rank layer B is laminated on the intermediate layer A and the lower rank layer C is laminated under the intermediate layer A. Also, the necessary electric conductivity pattern 155-170 formed in the exposed surface of the upper rank layer B and the lower rank layer C should be understood. Those which are positioned in the exposed surface of the lower rank layer C among the electric conductivity pattern 155-170 and has the greatest area (electric conductivity pattern 166) is used as a heat dissipation pattern for dissipating the heat of the electronic component 48 and 51.

The module 50 shown in FIG. 5 is completed by attaching necessary surface mount components (electronic component 78-82 of FIG. 5) after performing the above processes and attaching a cover 40a when needed.

The module 40 which has such a structure has the following results.

Since the plate-like core member 41 consisting of material (Cu, Alloy 42, Invar, etc.) having excellent electric conductivity, excellent heat conductivity and high rigidity is constituted as a base, bending stress of the substrate can be minimized with the rigidity of the core member 41 and substrate deformation which is not preferred can be avoided or controlled. Therefore, since conventional reinforcement (glass cloth) in the core member 41 is not needed, the exceptional effect of not producing associated problems related to the glass cloth (Notably, the problem of ion migration and the problem of the increased manufacturing cost accompanying the glass cloth cutting process at the time of cavity shaping.) is acquired.

Since the "island" shaped sections are not removed when the column segments are formed in a needed section wherein a resin (rear side resin layer 43) is affixed on one side (embodiment rear surface) of the core member 41, these can be used as the island-shaped section 56, 57 (column segments). Then, the electrical signal transmission paths and power supply transmission paths between layers can easily be constituted via the island-shaped sections 56, 57 and simplification of the modular design can be achieved.

A cavity (bottomless hole 44-47) can be formed in the core member 21, as well as the electronic components 48-51 can be readily embedded in the cavity and high density packaging of the substrate can be conjointly improved with surface mounting.

When an electronic component with a short height size or tall height size is embedded, a height size adjustment member 54 is inserted or a hole in the rear side resin layer is used. The height size of electronic components can be readily adjusted and set properly so that the upper surface height position of an electronic component does not exceed the upper surface height position of the core member 41. For this reason, it can respond to loading at the time of manufacturing the composite multi-layer substrate and breakage of the electronic components can be prevented.

When dissipating the heat of the electronic components, the core member 41 can be used for a heat dissipation path or a heat dissipation pattern (electrode pattern 166 of FIG. 11B) formed in the exposed surface of the lower rank layer C can be used for heat dissipation. Especially the electronic component 48, 51 which generate a large amount of heat can be used in the module 40 constituted by embedding and can be considered as a suitable object.

Curvature of the substrate can be avoided or controlled to the intermediate layer A by making the intermediate rank layer A, upper rank layer B and lower rank layer C into a substantially symmetrical structure.

As set forth above, the advantages of the present invention will now be explained.

The present invention comprises a core member having sufficient rigidity to resolve and eliminate various inconveniences (Namely, aggravation of electrical properties by accompanying generation of ion migration and the increased manufacturing cost accompanying the glass cloth cutting process) that accompany the use of conventional art type glass cloth as a reinforcing fabric material.

The present invention comprises a core member having sufficient rigidity to resolve and eliminate various inconveniences (Namely, aggravation of electrical properties by accompanying generation of ion migration and the increased manufacturing cost accompanying the glass cloth cutting process.) that accompany the use of conventional art type glass cloth as a reinforcing fabric material.

According to the present invention, since the core member uses a metallic core material the desired rigidity can be ensured and thus making the glass cloth fabric no longer necessary, and further the core member can be used also as an electrical signal path and as a heat dissipation path.

According to the present invention, the core member is entirely covered by resin material and the core member is isolated from ambient air. Thus, deterioration by oxidization, etc. can be prevented and durability can be improved.

According to the present invention, using other sections of the core member and divided column segments can be used as a part of the electrical signal transmission path or power supply voltage transmission path to the direction of the front and rear surfaces of the substrate and flexibility of the wiring design can be improved.

According to the present invention, the core member can be used as a heat dissipation path of electronic components, and especially in cases when embedding electronic components which generate a large amount of heat can be considered as a suitable object.

According to the present invention, the upper surface height position of electronic components can respond to loading at the time of manufacturing the composite multi-layer substrate and breakage of the electronic components can be prevented.

According to the present invention, the height relation between electronic components and the core member can be adjusted and the upper surface height position of the core member can be made higher than the upper surface height position of an electronic component.

According to the present invention, the height size adjustment member used for the height size adjustment can be used also as a heat dissipation member.

According to the present invention, a module which has the effects of the present invention according to the claims can be produced.

While the present invention has been described with reference to the preferred embodiments, it is intended that the invention be not limited by any of the details of the description therein but includes all the embodiments which fall within the scope of the appended claims.

What is claimed is:

1. A composite multi-layer substrate comprising:
   a flat plate-like core member formed of a material having excellent electric conductivity, heat conductivity and high rigidity properties;
   a front side resin layer covering a front surface of said core member;
   a rear side resin layer covering a rear surface of said core member;
   a bottomless hole formed in said core member penetrating a front and rear of said core member;
   an electronic component mounted in said bottomless hole, the thickness of the electronic component after mounting in said bottomless hole at least does not cross the upper surface height position of said core member;
   a small hole formed in either one or both of said front side resin layer and said rear side resin layer located directly above or directly below the electronic component and extends in a vertical direction of the front surface and the rear surface of said core member; and
   an electrode formed on an interior portion of said small hole;
   wherein an electrical connection to the electronic component is provided via the electrode.

2. A composite multi-layer substrate comprising:
   a flat plate-like core member formed of a material having excellent electric conductivity, heat conductivity and high rigidity properties;
   a front side resin layer covering a front surface of said core member;
   a rear side resin layer covering a rear surface of said core member;
   a bottomless hole formed in said core member and said rear side resin layer penetrating a front and rear of said core member and a front and rear of said rear side resin layer;
   an electronic component mounted in said bottomless hole, the thickness of the electronic component height size being lower than a depth size of said core member; and
   a height size adjustment member having excellent heat conductivity interposed among said electronic component and said core member and said rear side resin layer, wherein a rear side surface of the height size adjustment member and the rear side resin layer form a flat surface;
   wherein said height size adjustment member is interposed between the bottom of said electronic component when said electronic component height size is lower than the depth size of said core member mounted in said bottomless hole, wherein said height size adjustment member is adapted to adjusting a height of said electronic component.

3. A composite multi-layer substrate comprising:
   a flat plate-like core member formed of a material having excellent electric conductivity, heat conductivity and high rigidity properties;
   a front side resin layer covering a front surface of said core member;
   a rear side resin layer covering a rear surface of said core member;
   a bottomless hole formed in said core member and said rear side resin layer penetrating a front and rear of said core member and a front and rear of said rear side resin layer;
   an electronic component mounted in said bottomless hole, the thickness of the electronic component height size being lower than a depth of said core member; and
   a height size adjustment member interposed among said electronic component and said core member and said rear side resin layer;
   wherein said core member is a subtractively patterned core member.

4. The composite multi-layer substrate according to claim 1, further comprising:
   a column segment which divides said core member and penetrates said front and rear surfaces in a thickness direction of said core member; and
   said column segment is adapted to providing an electrical signal transmission path or a power supply voltage transmission path to the front and rear surfaces of said substrate.

5. A composite multi-layer substrate comprising:
   a flat plate-like core member formed of a material having excellent electric conductivity, heat conductivity and high rigidity properties;
   a front side resin layer covering a front surface of said core member;
   a rear side resin layer covering a rear surface of said core member;
   a flat bottomed hole formed in an opening of either one of said front surface of said core member or said rear surface of said core member; and
   an electronic component mounted in said flat bottomed hole, the thickness of the electronic component after mounting in said flat bottomed hole at least does not cross the upper surface height position of said core member;
   a small hole formed in either one or both of said front side resin layer and said rear side resin layer located directly above or directly below the electronic component and extends in a vertical direction of the front surface and the rear surface of said core member; and
   an electrode formed on an interior portion of said small hole;
   wherein an electrical connection to the electronic component is provided via the electrode.

6. The composite multi-layer substrate according to claim 1, wherein said structures are thicknesses.

7. The composite multi-layer substrate according to claim 5, wherein said structures are thicknesses.

* * * * *